(12) United States Patent
Ishibashi

(10) Patent No.: US 9,630,296 B2
(45) Date of Patent: Apr. 25, 2017

(54) SUBSTRATE PROCESSING APPARATUS

(71) Applicant: EBARA CORPORATION, Toyko (JP)

(72) Inventor: Tomoatsu Ishibashi, Tokyo (JP)

(73) Assignee: Ebara Corporation, Tokyo (JP)

(*) Notice: Subject to any disclaimer, the term of this patent is extended or adjusted under 35 U.S.C. 154(b) by 0 days.

(21) Appl. No.: 14/254,829

(22) Filed: Apr. 16, 2014

(65) Prior Publication Data

US 2014/0352608 A1    Dec. 4, 2014

(30) Foreign Application Priority Data

Apr. 19, 2013   (JP) .................................. 2013-088255

(51) Int. Cl.
| | |
|---|---|
| B05C 11/02 | (2006.01) |
| B05C 3/02 | (2006.01) |
| B05C 5/02 | (2006.01) |
| B24B 57/02 | (2006.01) |
| B24B 37/04 | (2012.01) |
| H01L 21/67 | (2006.01) |

(52) U.S. Cl.
CPC .......... *B24B 57/02* (2013.01); *B05C 5/0254* (2013.01); *B24B 37/04* (2013.01); *H01L 21/67051* (2013.01); *H01L 21/67219* (2013.01)

(58) Field of Classification Search
USPC ........... 118/52, 612, 56, 319, 320, 410, 302; 134/6, 902, 198, 153, 26, 1.3; 396/604, 396/611, 627; 427/240; 15/77
See application file for complete search history.

(56) References Cited

U.S. PATENT DOCUMENTS

| | | | |
|---|---|---|---|
| 5,919,520 A * | 7/1999 | Tateyama et al. ............ 427/240 |
| 2004/0000328 A1* | 1/2004 | Liu et al. ........................ 134/30 |
| 2004/0141130 A1* | 7/2004 | Kawata ............ G02F 1/136286 |
| | | | 349/139 |
| 2010/0130022 A1* | 5/2010 | Park .................. H01L 21/67178 |
| | | | 438/758 |
| 2011/0240601 A1* | 10/2011 | Hashizume ....... H01L 21/02063 |
| | | | 216/83 |

FOREIGN PATENT DOCUMENTS

| | | | |
|---|---|---|---|
| JP | 09-171985 A | | 6/1997 |
| JP | 09-223681 | | 8/1997 |
| JP | 11074178 A | * | 3/1999 |
| JP | 2000-153210 A | | 6/2000 |
| JP | 2004039975 A | * | 2/2004 |
| JP | 2005-194613 A | | 7/2005 |
| JP | 2007-180144 A | | 7/2007 |
| JP | 2011-165751 | | 8/2011 |
| JP | 2011-216608 A | | 10/2011 |
| WO | WO 2006/082780 A1 | | 8/2006 |

OTHER PUBLICATIONS

English Translation JP2004-039975A Feb. 2004.*

* cited by examiner

*Primary Examiner* — Yewebdar Tadesse
(74) *Attorney, Agent, or Firm* — Baker & Hostetler LLP

(57) ABSTRACT

A substrate processing apparatus capable of preventing corrosion of metal interconnects of a substrate formed thereon is disclosed. The substrate processing apparatus includes a substrate holder configured to hold a substrate horizontally and rotate the substrate, and a slit nozzle configured to supply a processing liquid onto a surface of the substrate. The slit nozzle is adjacent to the surface of the substrate and extends in approximately a radial direction of the substrate.

10 Claims, 14 Drawing Sheets

MOVING DIRECTION OF WAFER

MOVING DIRECTION OF WAFER

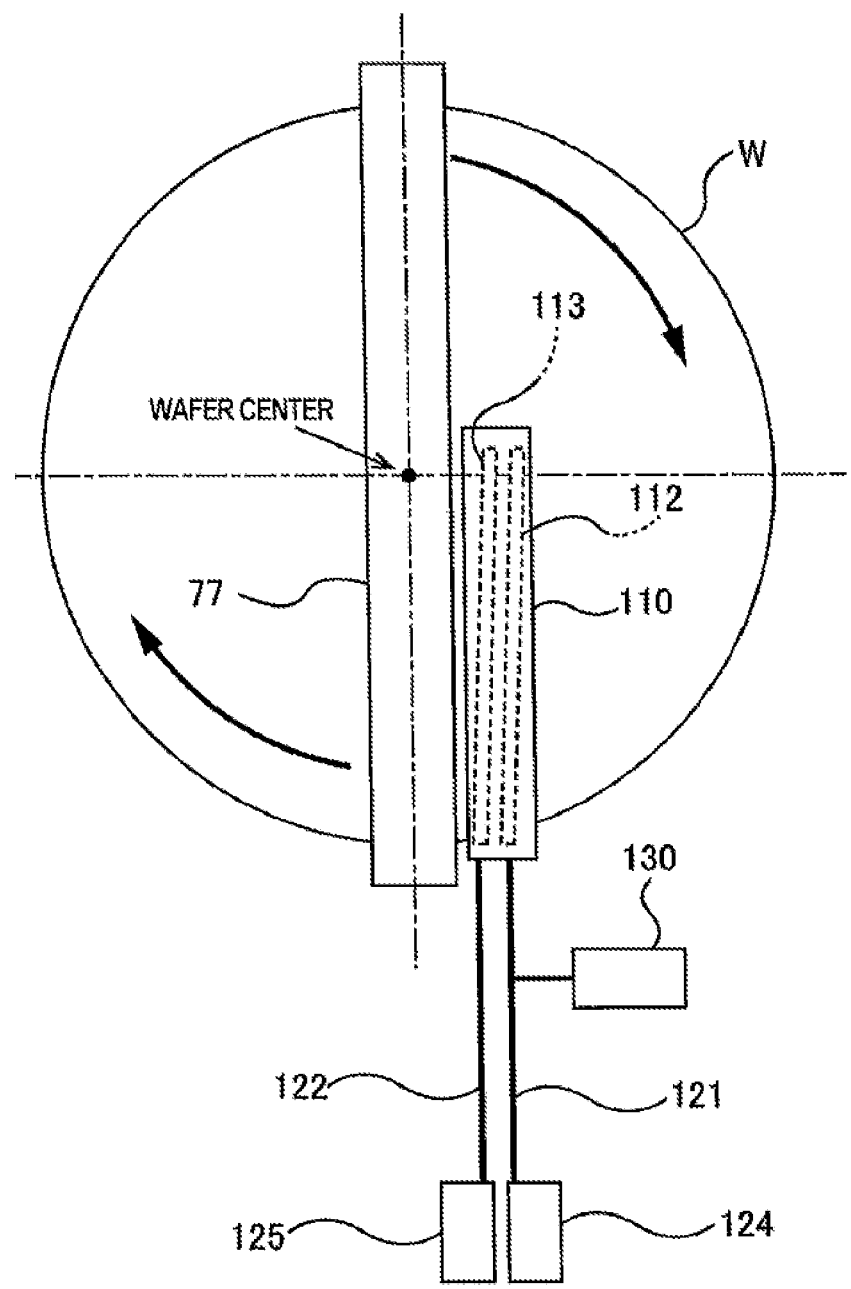

SUBSTRATE PROCESSING APPARATUS

CROSS REFERENCE TO RELATED APPLICATION

This document claims priority to Japanese Patent Application Number 2013-088255 filed Apr. 19, 2013, the entire contents of which are hereby incorporated by reference.

BACKGROUND

In a manufacturing process of a semiconductor device, various films having different physical properties are formed on a silicon substrate and these films are subjected to various processes, thus forming fine metal interconnects. For example, in a damascene interconnect forming process, interconnect trenches are formed in a film, and the interconnect trenches are then filled with metal, such as Cu. Thereafter, an excessive metal is removed by chemical mechanical polishing (CMP), so that metal interconnects are formed.

A CMP apparatus (or a polishing apparatus) for polishing a substrate typically includes an apparatus for cleaning and drying a polished substrate. Cleaning of the substrate is performed by bringing a cleaning tool, such as a roll sponge, into sliding contact with the substrate while rotating the substrate horizontally. After cleaning of the substrate surface, ultrapure water (DIW) is supplied onto the surface of the rotating substrate, thereby rinsing the surface of the substrate. Before the substrate is dried, the ultrapure water is further supplied onto the surface of the rotating substrate to rinse the surface of the substrate.

A chemical liquid, which is supplied for cleaning the substrate, is diluted 30 to 500 times with the ultrapure water. This ultrapure water has been deaerated in advance so that dissolved oxygen is removed from the ultrapure water. Generally, an amount of oxygen dissolved in the ultrapure water is at most 10 ppb, or may be even regulated at 5 ppb or less.

FIG. 15 is a schematic view showing an example of a conventional apparatus for rinsing a substrate by supplying the ultrapure water onto a surface of the substrate. A substrate (or wafer) W is rotated horizontally by chucks (not shown), while the ultrapure water is supplied onto a central portion of the substrate from a tube nozzle 201 which is disposed outside of the substrate W. FIG. 16 shows a schematic view showing another example of a conventional apparatus for rinsing a substrate by supplying the ultrapure water onto a surface of the substrate. In this apparatus, a substrate (or wafer) W is rotated horizontally, while the ultrapure water is sprayed onto a surface of the substrate from a spray nozzle 202 which is disposed outside of the substrate W.

In recent years, copper has been widely used for metal interconnects of devices. It is a known fact that, if the amount of dissolved oxygen is 1000 ppb (1 ppm) or more, the copper (Cu) is likely to be corroded. As described above, although the amount of dissolved oxygen in the ultrapure water is very small, the oxygen in an atmosphere is dissolved in the ultrapure water until the ultrapure water reaches the surface of the substrate when using the conventional apparatus as shown in FIG. 15 and FIG. 16, thus increasing the amount of dissolved oxygen. As a result, the corrosion of the copper interconnects formed on the substrate surface may be accelerated. In particular, the copper interconnects formed on a peripheral portion of the substrate may be rapidly corroded because the peripheral portion of the substrate rotates at a higher velocity.

As one solution for the copper interconnect corrosion, there has been generally known a method using hydrogen water (functional water) that is produced by adding hydrogen into the ultrapure water. However, producing the hydrogen water entails a large-sized equipment, which increases costs. Moreover, in this method also, the hydrogen water is passed through the atmosphere to reach the substrate. Therefore, the oxygen in the atmosphere is dissolved in the hydrogen water, hindering an effect of the hydrogen water that can prevent the copper corrosion. It is possible to avoid such oxygen dissolution if a substrate processing space is filled with an inert gas, such as nitrogen gas. However, the apparatus structure becomes complicated, and the costs may further increase because it is necessary to take a security measure for the consumption and the use of the inert gas.

SUMMARY OF THE INVENTION

It is therefore an object to provide a substrate processing apparatus capable of preventing corrosion of metal interconnects of a substrate formed thereon.

Embodiments, which will be described below, relate to a substrate processing apparatus for processing a surface of a substrate, such as a wafer, by supplying a processing liquid (e.g., pure water, chemical liquid, or functional water) onto the substrate, and more particularly to a substrate processing apparatus capable of preventing corrosion of metal interconnects of a substrate formed on a surface thereof.

In an embodiment, there is disclose a substrate processing apparatus, comprising: a substrate holder configured to hold a substrate horizontally and rotate the substrate; and a slit nozzle configured to supply a processing liquid onto a surface of the substrate, the slit nozzle being adjacent to the surface of the substrate and extending in approximately a radial direction of the substrate.

In an embodiment, the slit nozzle is inclined with respect to a direction perpendicular to the surface of the substrate.

In an embodiment, an angle of inclination of the slit nozzle at a peripheral portion of the substrate is larger than an angle of inclination of the slit nozzle at a central portion of the substrate.

In an embodiment, an angle of inclination of the slit nozzle increases gradually from the angle of inclination at the central portion of the substrate to the angle of inclination at the peripheral portion of the substrate.

In an embodiment, a flow rate of the processing liquid at a central portion of the substrate is higher than a flow rate of the processing liquid at a peripheral portion of the substrate.

In an embodiment, the substrate processing apparatus further comprises an inert-gas supply module configured to dissolve an inert gas in the processing gas that is delivered to the slit nozzle.

In an embodiment, the slit nozzle comprises a first slit nozzle for supplying a first processing liquid onto the surface of the substrate and a second slit nozzle for supplying a second processing liquid onto the surface of the substrate.

In an embodiment, the substrate processing apparatus further comprises a scrubbing tool configured to scrub the surface of the substrate, the slit nozzle being adjacent to the scrubbing tool.

According to the above-described embodiments, the processing liquid is supplied right above the substrate surface. Therefore, the oxygen in the atmosphere is hardly dissolved in the processing liquid. Further, use of the slit nozzle can reduce a contact area of the processing liquid and the atmosphere and can thus effectively prevent the oxygen in the atmosphere from being dissolved in the processing liquid. Accordingly, the amount of dissolved oxygen in the processing liquid can be very small, and as a result the corrosion of the metal interconnects formed on the substrate surface can be prevented.

BRIEF DESCRIPTION OF THE DRAWINGS

FIG. 9 is a plan view showing a part of the substrate cleaning unit provided with an inert-gas supply module;

DETAILED DESCRIPTION OF EMBODIMENTS

Figure 1:
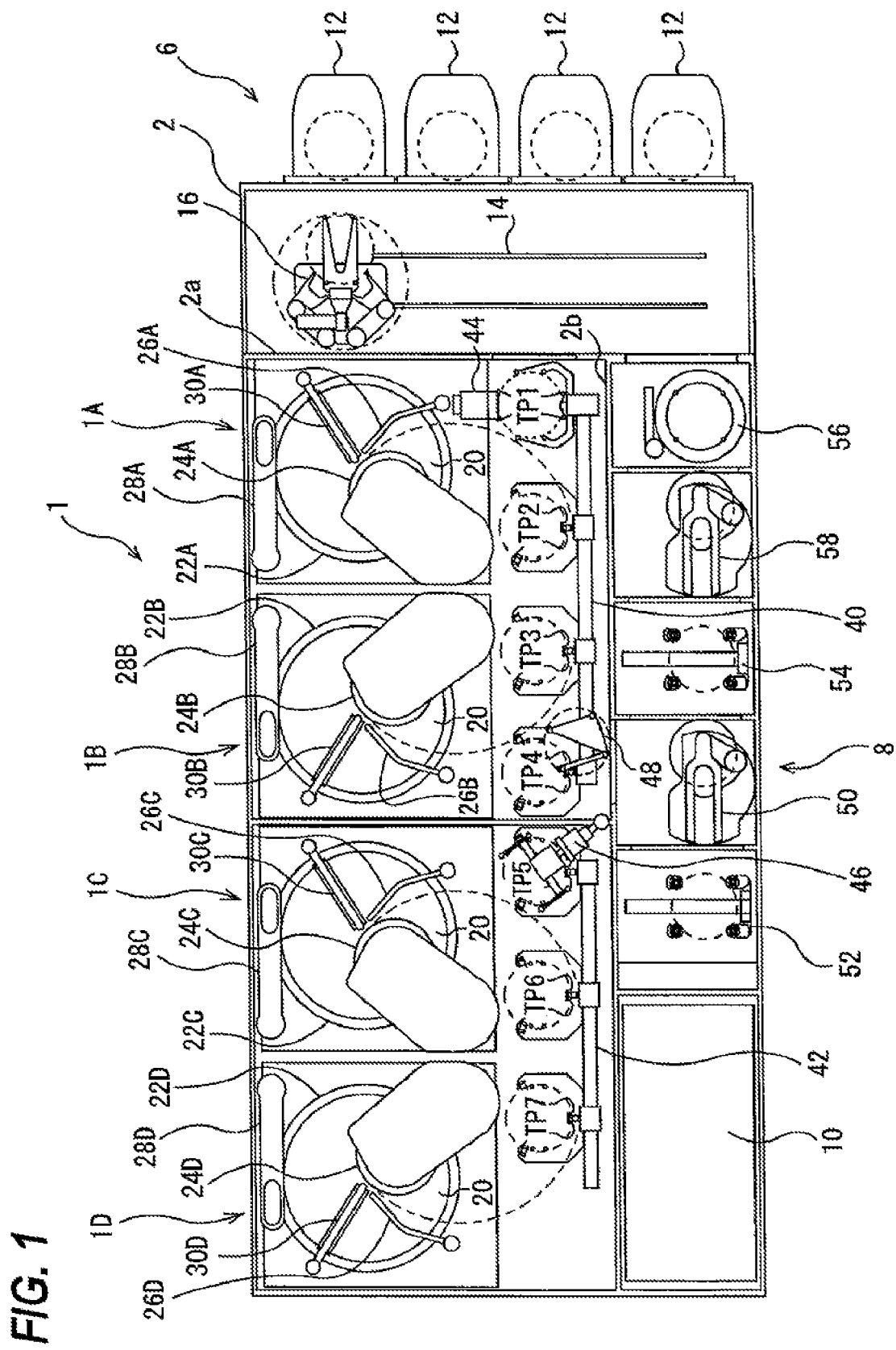
FIG. 1 is a diagram showing a polishing apparatus provided with polishing units, cleaning units, and a drying unit.

Embodiments will be described below with reference to the drawings. FIG. 1 is a view showing a polishing apparatus having polishing units, cleaning units, and a drying unit. This polishing apparatus is an apparatus capable of performing a series of processes including polishing, cleaning, and drying of a wafer (or a substrate). As shown in FIG. 1, the polishing apparatus has a housing 2 in approximately a rectangular shape. An interior space of the housing 2 is divided by partitions 2a, 2b into a load-unload section 6, a polishing section 1, and a cleaning section 8. The polishing apparatus includes an operation controller 10 configured to control wafer processing operations.

The load-unload section 6 has load ports 12 on which wafer cassettes are placed, respectively. A plurality of wafers are stored in each wafer cassette. The load-unload section 6 has a moving mechanism 14 extending along an arrangement direction of the load ports 12. A transfer robot (loader) 16 is provided on the moving mechanism 14, so that the transfer robot 16 can move along the arrangement direction of the wafer cassettes. The transfer robot 16 moves on the moving mechanism 14 so as to access the wafer cassettes mounted to the load ports 12.

The polishing section 1 is an area where a wafer is polished. This polishing section 1 includes a first polishing unit 1A, a second polishing unit 1B, a third polishing unit 1C, and a fourth polishing unit 1D. The first polishing unit 1A includes a first polishing table 22A to which a polishing pad 20, having a polishing surface, is attached, a first top ring 24A for holding a wafer and pressing the wafer against the polishing pad 20 on the first polishing table 22A so as to polish the wafer, a first polishing liquid supply nozzle 26A for supplying a polishing liquid (e.g., slurry) and a dressing liquid (e.g., pure water) onto the polishing pad 20, a first dressing unit 28A for dressing the polishing surface of the polishing pad 20, and a first atomizer 30A for ejecting a mixture of a liquid (e.g., pure water) and a gas (e.g., nitrogen gas) or a liquid (e.g., pure water), in an atomized state, onto the polishing surface of the polishing pad 20.

Similarly, the second polishing unit 1B includes a second polishing table 22B to which a polishing pad 20 is attached, a second top ring 24B, a second polishing liquid supply nozzle 26B, a second dressing unit 28B, and a second atomizer 30B. The third polishing unit 1C includes a third polishing table 22C to which a polishing pad 20 is attached, a third top ring 24C, a third polishing liquid supply nozzle 26C, a third dressing unit 28C, and a third atomizer 30C. The fourth polishing unit 1D includes a fourth polishing table 22D to which a polishing pad 20 is attached, a fourth top ring 24D, a fourth polishing liquid supply nozzle 26D, a fourth dressing unit 28D, and a fourth atomizer 30D.

A first linear transporter 40 is disposed adjacent to the first polishing unit 1A and the second polishing unit 1B. The first linear transporter 40 is a device for transporting a wafer between four transfer positions (i.e., a first transfer position TP1, a second transfer position TP2, a third transfer position TP3 and a fourth transfer position TP4). A second linear transporter 42 is disposed adjacent to the third polishing unit 1C and the fourth polishing unit 1D. The second linear transporter 42 is a device for transporting a wafer between, three transfer positions (i.e., a fifth transfer position. TP5, a sixth transfer position TP6, and a seventh transfer position TP7).

A lifter 44 for receiving the wafer from the transfer robot 16 is disposed adjacent to the first transfer position TP1. The wafer is transported from the transfer robot 16 to the first linear transporter 40 via the lifter 44. A shutter (not shown in the drawing) is provided on the partition 2a. This shutter is located between the lifter 44 and the transfer robot 16. When the wafer is to be transported, the shutter is opened to allow the transfer robot 16 to transport the wafer to the lifter 44.

The wafer is transported to the lifter 44 by the transfer robot 16, then transported from the lifter 44 to the first linear transporter 40, and further transported to the polishing units 1A, 1B by the first linear transporter 40. The top ring 24A of the first polishing unit 1A is movable between a position above the first polishing table 22A and the second transfer position TP2 by a swing motion of the top ring 24A. Therefore, the wafer is transferred to and from the top ring 24A at the second transfer position TP2.

Similarly, the top ring 24B of the second polishing unit 1B is movable between a position above the polishing table 22B and the third transfer position TP3, and the wafer is transferred to and from the top ring 24B at the third transfer position TP3. The top ring 24C of the third polishing unit 1C is movable between a position above the polishing table 22C and the sixth transfer position TP6, and the wafer is transferred to and from the top ring 24C at the sixth transfer position TP6. The top ring 24D of the fourth polishing unit 1D is movable between a position above the polishing table 1D) and the seventh transfer position TP7, and the wafer is transferred to and from the top ring 24D at the seventh transfer position TP7.

A swing transporter 46 is provided between the first linear transporter 40, the second linear transporter 42, and the cleaning section 8. Transporting of the wafer from the first linear transporter 40 to the second linear transporter 42 is performed by the swing transporter 46. The wafer is transported to the third polishing unit 1C and/or the fourth polishing unit 1D by the second linear transporter 42.

A temporary stage 48 for the wafer W is disposed beside the swing transporter 46. This temporary stage 48 is mounted to a non-illustrated frame. As shown in FIG. 1, the temporary stage 48 is disposed adjacent to the first linear transporter 40 and located between the first linear transporter 40 and the cleaning section 8. The swing transporter 46 is configured to transport the wafer between the fourth transfer position TP4, the fifth transfer position TP5, and the temporary stage 48.

The wafer, once placed on the temporary stage 48, is transported to the cleaning section 8 by a first transfer robot 50 of the cleaning section 8. The cleaning section 8 includes a first cleaning unit 52 and a second cleaning unit 54 each for cleaning the polished wafer with a processing liquid, and a drying unit 56 for drying the cleaned wafer. The first transfer robot 50 is operable to transport the wafer from the temporary stage 48 to the first cleaning unit 52 and further transport the wafer from the first cleaning unit 52 to the second cleaning unit 54. A second transfer robot 58 is disposed between the second cleaning unit 54 and the drying unit 56. This second transfer robot 58 is operable to transport the wafer from the second cleaning unit 54 to the drying unit 56.

The dried wafer is removed from the drying unit 56 and returned to the wafer cassette by the transfer robot 16. In this manner, a series of processes including polishing, cleaning, and drying of the wafer is performed.

Figure 2:
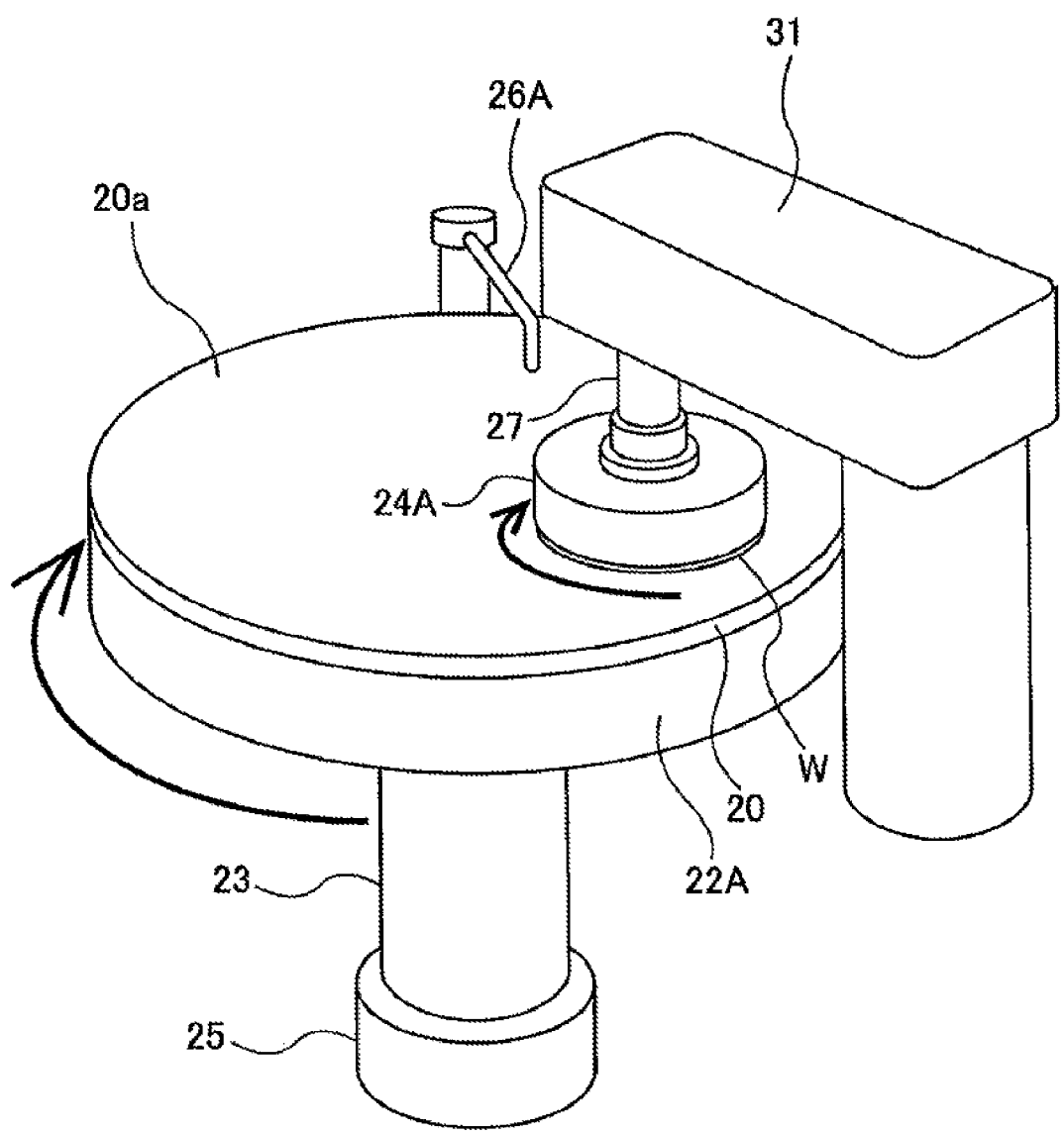
FIG. 2 is a perspective view of a first polishing unit.

The first polishing unit 1A, the second polishing unit 1B, the third polishing unit 1C, and the fourth polishing unit 1D have the same structure as each other. Therefore, the first polishing unit 1A will be described below. FIG. 2 is a schematic perspective view showing the first polishing unit 1A. As shown in FIG. 2, the first polishing unit 1A includes the polishing table 22A supporting the polishing pad 20, the top ring 24A for pressing the wafer W against the polishing pad 20, and the polishing liquid supply nozzle 26A for supplying the polishing liquid (or slurry) onto the polishing pad 20. In FIG. 2, illustration of the first dressing unit 28A and the first atomizer 30A is omitted.

The polishing table 22A is coupled via a table shaft 23 to a table motor 25 disposed below the polishing table 22A, so that the polishing table 22A is rotated by the table motor 25 in a direction indicated by arrow. The polishing pad 20 is attached to an upper surface of the polishing table 22A. The polishing pad 20 has an upper surface, which provides a polishing surface 20a for polishing the wafer W. The top ring 24A is secured to a lower end of a top ring shaft 27. The top ring 24A is configured to be able to hold the wafer W on its lower surface by vacuum suction. The top ring shaft 27 is coupled to a rotating device (not shown) disposed in a top ring arm 31, so that the top ring 24A is rotated by the rotating device through the top ring shaft 27.

Polishing of the surface of the wafer W is performed as follows. The top ring 24A and the polishing table 22A are rotated in respective directions indicated by arrows, and the polishing liquid (e.g., the slurry) is supplied from the polishing liquid supply nozzle 26A onto the polishing pad 20. In this state, the wafer W is pressed against the polishing surface 20a of the polishing pad 20 by the top ring 24A. The surface of the wafer W is polished by a mechanical action of abrasive grains contained in the polishing liquid and a chemical action of a chemical component contained in the polishing liquid.

Figure 3:
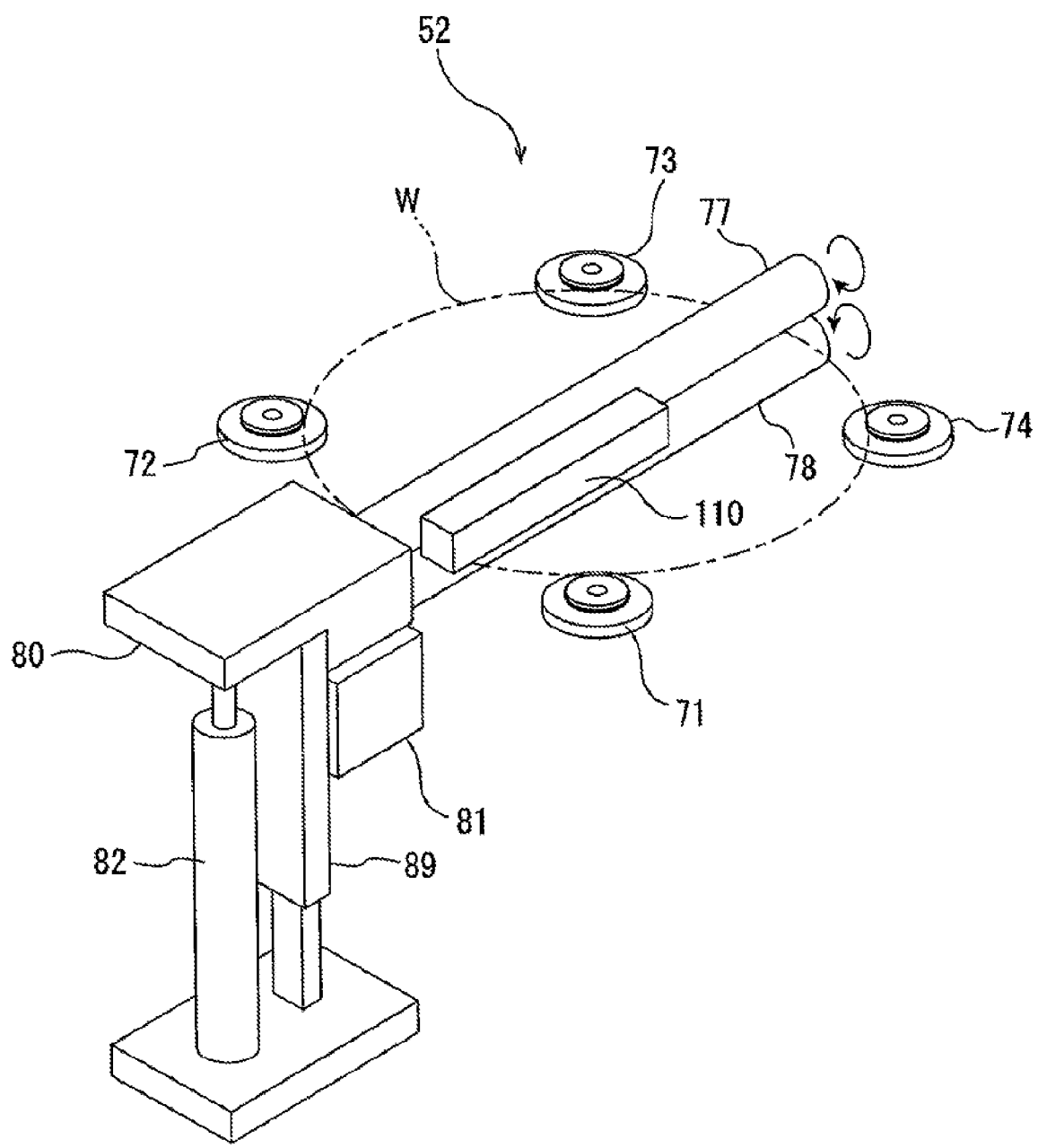
FIG. 3 is a perspective view of a first cleaning unit (a substrate cleaning unit)

The first cleaning unit 52 and the second cleaning unit 54 have the same structure as each other. Therefore, the first cleaning unit 52 will be described below. FIG. 3 is a schematic perspective view showing the first cleaning unit (substrate cleaning apparatus) 52. As shown in FIG. 3, the first cleaning unit 52 includes four holding rollers (i.e., a substrate holder) 71, 72, 73, 74 for holding and rotating the wafer W horizontally, roll sponges (scrubbing tools) 77, 78 configured to contact upper and lower surfaces of the wafer W, respectively, rotating devices 80, 81 for rotating the roll sponges 77, 78, respectively, and a processing-liquid supply module 110 for supplying a first processing liquid and a second processing liquid onto the upper surface (the surface on which a dielectric film, a metallic film, or a structure, such as a device, including a dielectric film and a dielectric film and metallic film is formed) of the wafer W.

In this embodiment, pure water is used as the first processing liquid, and a chemical liquid diluted with ultra-pure water (which will be hereinafter referred simply as chemical liquid) is used as the second processing liquid. In the following descriptions, the first processing liquid and the second processing liquid may be collectively referred to as processing liquid. The processing-liquid supply module 110 is located right above the upper surface of the wafer W, and disposed adjacent to the upper roll sponge (scrubbing tool) 77. Although not shown in the drawings, a lower chemical-liquid supply nozzle and a lower pure-water supply nozzle are provided for supplying a chemical liquid and pure water, respectively, onto the lower surface of the wafer W.

The holding rollers 71, 72, 73, 74 are configured to be movable in directions closer to and away from the wafer W by a non-illustrated moving mechanism (e.g., an air cylinder). The rotating device 80, which is configured to rotate the upper roll sponge 77, is mounted to a guide rail 89 that guides a vertical movement of the rotating device 80. The rotating device 80 is supported by an elevating device 82 so that the rotating device 80 and the upper roll sponge 77 are moved in the vertical direction by the elevating device 82. Although not shown, the rotating device 81, which is configured to rotate the lower roll sponge 78, is also mounted to a guide rail. The rotating device 81 and the lower roll sponge 78 are moved vertically by an elevating device (not shown). A motor-drive mechanism employing a ball screw, an air cylinder, or the like is used as the elevating device. When the wafer W is to be cleaned, the roll sponges 77, 78 are moved closer to each other until the roll sponges 77, 78 contact the upper and lower surfaces of the wafer W, respectively.

Figure 4:
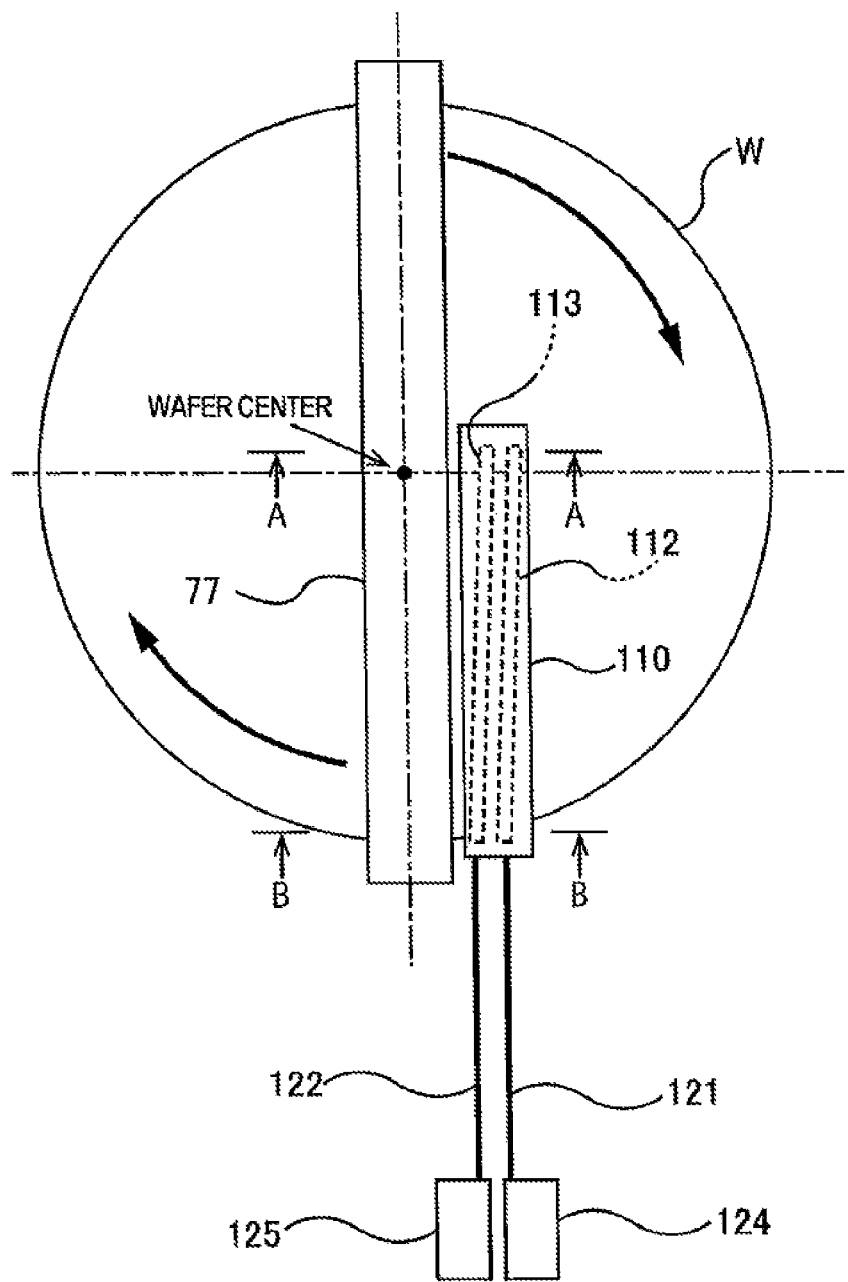
FIG. 4 is a plan view of a wafer, a roll sponge, and a processing-liquid supply module.
Figure 5:
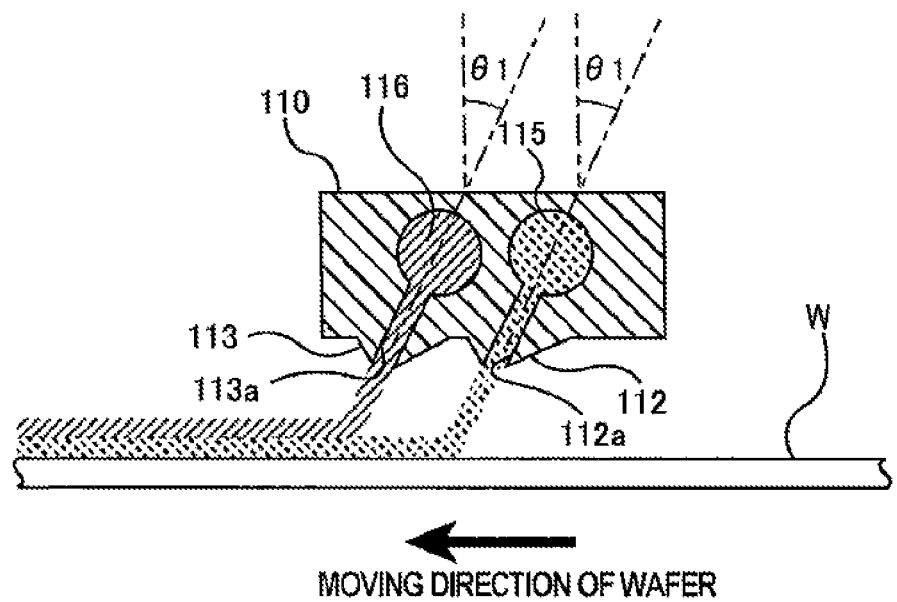
FIG. 5 is a cross-sectional view of the processing-liquid supply module taken along line A-A shown in FIG. 4.
Figure 6:
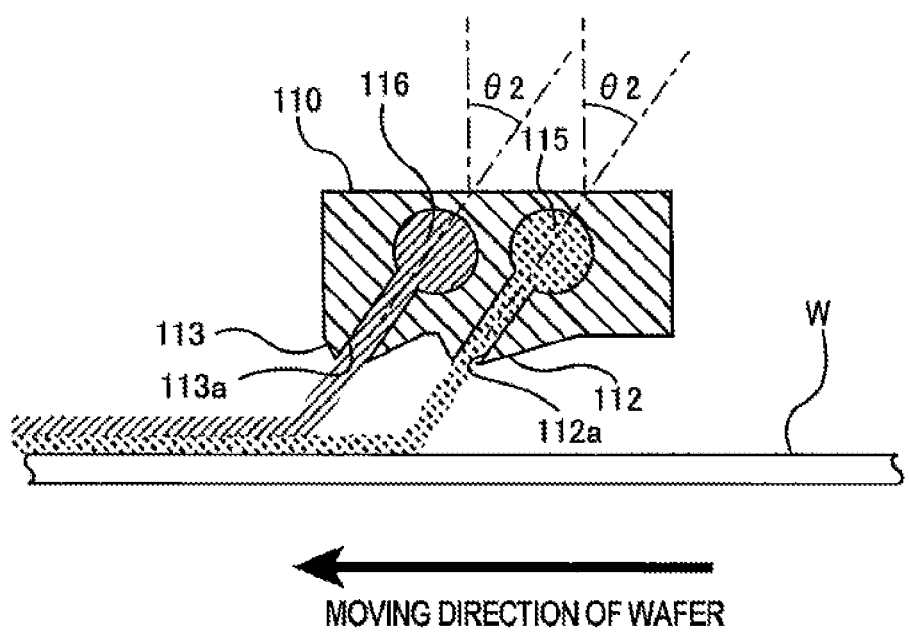
FIG. 6 is a cross-sectional view of the processing-liquid supply module taken along line B-B shown in FIG. 4.

FIG. 4 is a plan view showing the wafer W, the roll sponge 77, and the processing-liquid supply module 110. FIG. 5 is a cross-sectional view of the processing-liquid supply module 110 taken along line A-A shown in FIG. 4; and FIG. 6 is a cross-sectional view of the processing-liquid supply module 110 taken along line B-B shown in FIG. 4. Both of FIG. 5 and FIG. 6 show the cross-sectional view of the processing-liquid supply module 110 as viewed from a radial direction of the wafer W. The processing-liquid supply module 110 has a first slit nozzle 112 and a second slit nozzle 113 extending linearly along substantially the radial direction of the wafer W, and further has a first passage 115 and a second passage 116 coupled to the first slit nozzle 112 and the second slit nozzle 113. The first slit nozzle 112 and the second slit nozzle 113 are adjacent to each other.

As with the slit nozzles 112, 113, the first passage 115 and the second passage 116 extend along the radial direction of the wafer W. The first passage 115 has a closed inner end, and has an outer end that is coupled to a first processing-liquid supply source 124 through a first supply line 121. Similarly, the second passage 116 has a closed inner end, and has an outer end that is coupled to a second processing-liquid supply source 125 through a second supply line 122.

The pure water as the first processing liquid is supplied from the first processing-liquid supply source 124 through the first supply line 121 to the first passage 115 and further supplied from the first slit nozzle 112 onto the upper surface of the wafer W. Similarly, the chemical liquid as the second processing liquid is supplied from the second processing-liquid supply source 125 through the second supply line 122 to the second passage 116 and further supplied from the second slit nozzle 113 onto the upper surface of the wafer W.

The first slit nozzle 112 and the second slit nozzle 113 are adjacent to the upper surface of the wafer (substrate) W and extend along approximately the radial direction of the wafer W. These slit nozzles 112, 113 are parallel to each other. The first slit nozzle 112 and the second slit nozzle 113 have a first slit mouth 112a and a second slit mouth 113a, respectively, that face the upper surface of the wafer W. Each of the slit mouths 112a, 113a may be a single slit mouth or may be multiple slit mouths aligned in a straight line.

The first slit nozzle 112 and the second slit nozzle 113 are longer than a radius of the wafer W, outer ends of these slit nozzles 112, 113 are located above a peripheral portion of the wafer W, and inner ends of these slit nozzles 112, 113 are located beyond the center of the wafer W. Since the slit nozzles 112, 113 (and the slit mouths 112a, 113a) are longer than the radius of the wafer W, the processing liquid from the slit nozzles 112, 113 are supplied over the entire surface, including the center, of the wafer W.

The first slit nozzle 112 supplies the pure water onto the upper surface of the wafer W, and the second slit nozzle 113 supplied the chemical liquid onto the upper surface of the wafer W. The pure water as the first processing liquid has been deaerated in advance. The pure water is preferably ultrapure water that has been deaerated in advance. As shown in FIG. 5 and FIG. 6, the first slit nozzle 112 is located upstream of the second slit nozzle 113 with respect to a rotational direction (or a moving direction) of the wafer W. With this arrangement, the pure water is firstly supplied onto the upper surface of the wafer W, and the chemical liquid is then supplied onto the pure water. As a result, a lower layer of the pure water and an upper layer of the chemical liquid are formed on the wafer W.

Since the pure water has been deaerated in advance, the amount of dissolved oxygen in the pure water is very small. Because metal interconnects (e.g., copper interconnects) formed on the upper surface of the wafer W are covered with the pure water, this pure water serves as a protection film for the metal interconnects, thus preventing the corrosion of the metal interconnects. The pure water and the chemical liquid are mixed with each other by the roll sponge 77, and the mixture is then removed from the wafer W by a centrifugal force. The first slit nozzle 112 may be located downstream of the second slit nozzle 113. With this arrangement, the pure water serves as a protection film for the chemical liquid, and can protect the chemical liquid and the metal interconnects from the oxygen in the atmosphere.

The processing liquid is introduced from the outer ends of the first passage 115 and the second passage 116. Since the inner ends of the first passage 115 and the second passage 116 are closed, pressure gradient of the processing liquid is created in each of the first passage 115 and the second passage 116. Specifically, the pressure of the processing liquid is high at the inner ends of the passages 115, 116, while the pressure of the processing liquid is low at the outer ends of the passages 115, 116. Therefore, the flow rate of the processing liquid, discharged from the slit nozzles 112, 113, varies in accordance with the radial position of the wafer W.

Figure 7:
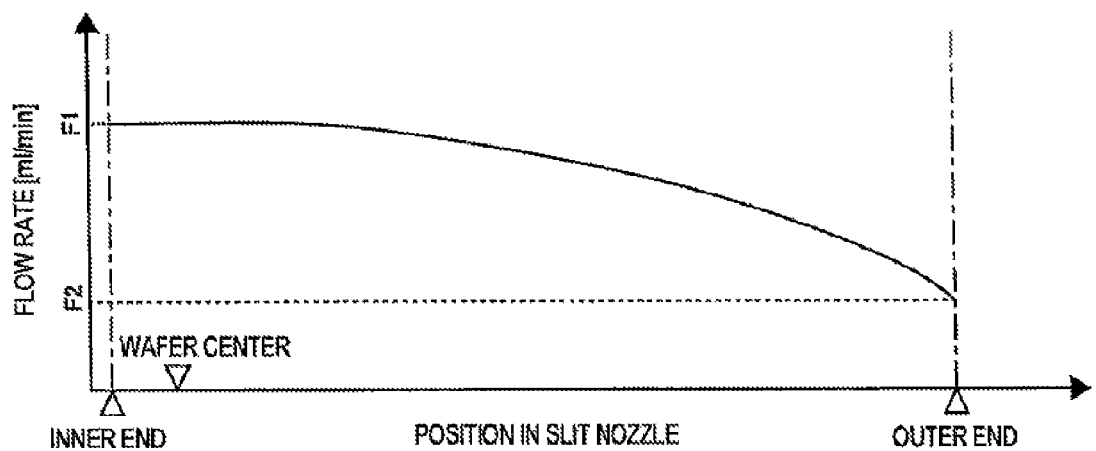
FIG. 7 is a graph showing flow rate of a processing liquid discharged from a first slit nozzle and a second slit nozzle.

FIG. 7 is a graph showing the flow rate of the processing liquid discharged from the first slit nozzle 112 and the second slit nozzle 113. In FIG. 7, vertical axis represents the flow rate of the processing liquid, and horizontal axis represents position ranging from the inner ends to the outer ends of the slit nozzles 112, 113. As shown in FIG. 7, the flow rate of the processing liquid decreases gradually from a value F1 at the inner ends of the slit nozzles 112, 113 to a value F2 at the outer ends of the slit nozzles 112, 113. Preferably, the value F2 at the outer ends of the slit nozzles 112, 113 is equal to or less than half the value F1 at the inner ends of the slit nozzles 112, 113.

When the wafer W is rotating, the centrifugal force acts on the processing liquid on the wafer W. The nearer the processing liquid approaches a circumferential edge of the wafer W, the larger the centrifugal force. Therefore, when the processing liquid contacts the wafer W, the processing liquid is forced to move radially outwardly in an instant and is thus removed from the wafer W. The processing liquid that contacts the roll sponge 77 at the peripheral portion of the wafer W is one that has been supplied to the central portion of the wafer W and moved outwardly from the central portion by the centrifugal force. Therefore, increasing the flow rate of the processing liquid at the central portion of the wafer W can make it possible to clean, the wafer W effectively. If the flow rate of the processing liquid is even along the radial direction of the wafer W or if the flow rate of the processing liquid at the peripheral portion is higher than that at the central portion, an large amount of processing liquid that is not used for cleaning of the wafer is expelled from the surface of the wafer W by the centrifugal force, thus lowering the cleaning efficiency. According to the present embodiment, the pressure gradient formed in the slit nozzles 112, 113 can make the flow rate of the processing liquid higher at the central portion of the wafer W than that at the peripheral portion of the wafer W. Accordingly, the cleaning unit can clean the surface of the wafer W effectively without using an excessive amount of processing liquid.

As shown in FIG. 5 and FIG. 6, the first slit nozzle 112 and the second slit nozzle 113, as viewed from the radial direction of the wafer W, are inclined with respect to a direction perpendicular to the surface of the wafer W (i.e., with respect to a vertical direction). More specifically, the slit mouths 112a, 113a of the slit nozzles 112, 113 are inclined toward the downstream side with respect to the moving direction of the wafer W. Since the upper roll sponge (scrubbing tool) 77 is disposed downstream of the slit nozzles 112, 113, these slit nozzles 112, 113 are inclined toward the roll sponge 77.

An angle of inclination of the slit nozzles 112, 113 varies gradually in accordance with the radial position of the wafer W. Specifically, as shown in FIG. 5 and FIG. 6, an angle θ2 of inclination of the slit nozzles 112, 113 at the peripheral portion of the wafer W is larger than an angle θ1 of inclination of the slit nozzles 112, 113 at the central portion of the wafer W. This is for preventing the processing liquid from being scattered around when the processing liquid impinges on the peripheral portion that is moving at a higher velocity, and for preventing the oxygen in the air from being dissolved in the scattered processing liquid. In one example, the angle θ1 of inclination of the slit nozzles 112, 113 at the central portion of the wafer W is larger than 0 and not more than 15 degrees ($0<\theta1\leq15°$), while the angle θ2 of inclination of the slit nozzles 112, 113 at the peripheral portion of the wafer W is not less than 30 degrees ($\theta2\geq30°$).

As shown in FIG. 4, the processing-liquid supply module 110 is located upstream of the roll sponge 77 with respect to the rotational direction (or moving direction) of the wafer W indicated by arrow. As discussed above, the first slit nozzle 112 and the second slit nozzle 113 are inclined toward the roll sponge 77 so that the processing liquid can reach the roll sponge 77 in as short a time as possible. When viewed from above the wafer W, the first slit nozzle 112 and the second slit nozzle 113 are inclined slightly with respect to the radial direction of the wafer W. More specifically, a distance between the outer ends of the slit nozzles 112, 113 and the roll sponge 77 is shorter than a distance between the inner ends of the slit nozzles 112, 113 and the roll sponge 77. This is for supplying a sufficient amount of processing liquid to the roll sponge 77 at the peripheral portion of the wafer W where a larger centrifugal force acts. This arrangement enables the slit nozzles 112, 113 to supply the processing liquid to the roll sponge 77 before the processing liquid is removed by the centrifugal force.

Tips of the first slit nozzle 112 and the second slit nozzle 113 (i.e., tips of the slit mouths 112a, 113a) are located close to the upper surface of the wafer W. A distance between the upper surface of the wafer W and the tips of the first slit nozzle 112 and the second slit nozzle 113 is preferably in a range of 10 mm to 30 mm. With this arrangement, the processing liquid that has been discharged from the slit nozzles 112, 113 is passed through the atmosphere in a very short period of time to reach the water W. Therefore, it is possible to minimize the amount of oxygen dissolved in the processing liquid. In addition, since a surface area of the processing liquid discharged from the slit nozzles 112, 113 is small as compared with the case of using spray nozzles, it is further possible to minimize the amount of oxygen dissolved in the processing liquid when travelling through the atmosphere. As a result, the corrosion of the metal interconnects (e.g., the copper interconnects) formed on the upper surface of the wafer W can be prevented.

Figure 8:
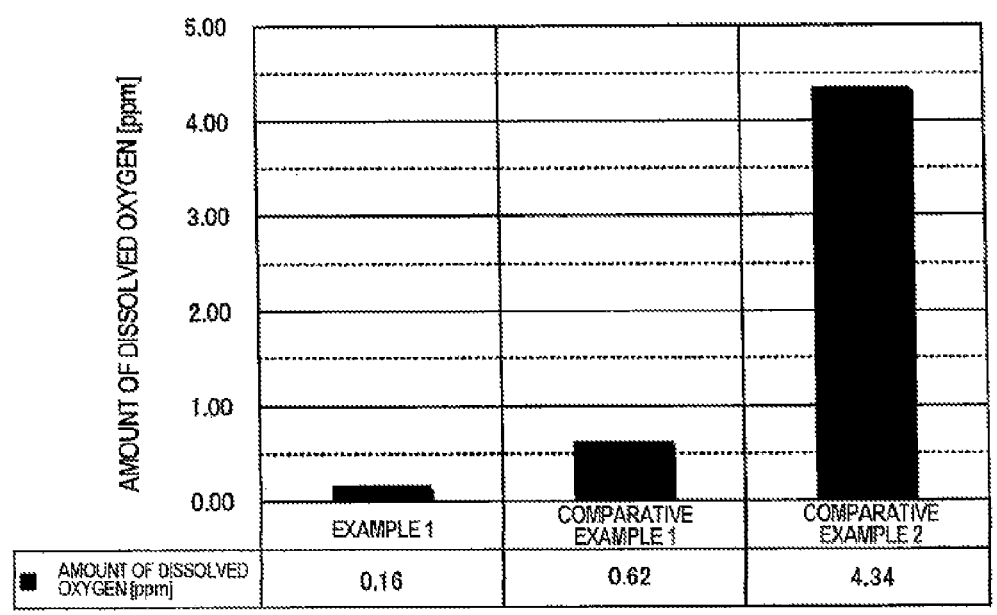
FIG. 8 is a diagram showing measurement results of an amount of dissolved oxygen in the processing liquid supplied to the wafer.
Figure 15:
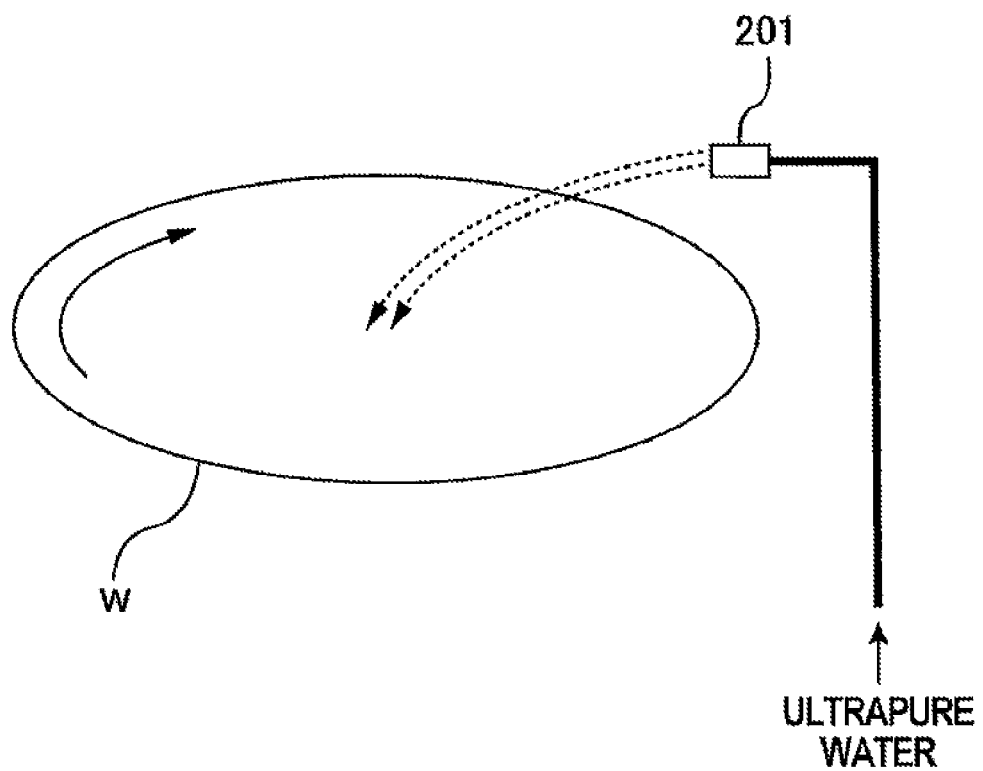
FIG. 15 is a schematic view of an example of a conventional apparatus for rinsing a substrate by supplying ultrapure water onto a surface of the substrate.
Figure 16:
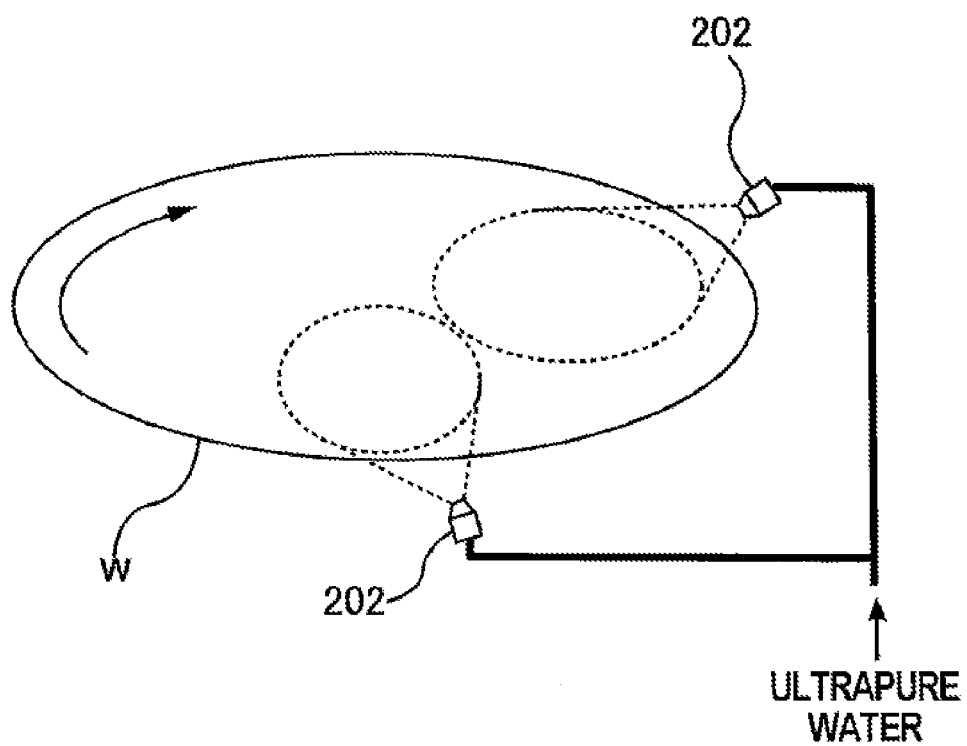
FIG. 16 is a schematic view of another example of a conventional apparatus for rinsing a substrate by supplying ultrapure water onto a surface of the substrate.

FIG. 8 is a diagram showing measurement results of the amount of dissolved oxygen [ppm] in the processing liquid supplied to the wafer W. An example 1 in FIG. 8 shows a measurement result when using the substrate cleaning apparatus according to the embodiment shown in FIG. 3, a comparative example 1 shows a measurement result r when using the conventional apparatus shown in FIG. 15, and a comparative example 2 shows a measurement result when using the conventional apparatus shown in FIG. 16. As can be seen from these measurement results, use of the substrate cleaning apparatus according to the above-discussed embodiment can reduce the amount of dissolved oxygen in the processing liquid on the wafer W.

Next, an example of a cleaning process of the wafer W will be described. First, the wafer W is rotated about its own axis. Subsequently, the pure water and the chemical liquid are supplied from the first slit nozzle 112 and the second slit nozzle 113 onto the upper surface of the wafer W, while the chemical liquid and the pure water are supplied from the non-illustrated lower chemical-liquid supply nozzle and the non-illustrated lower pure-water supply nozzle onto the lower surface of the wafer W. In this state, the roll sponges 77, 78 are placed in sliding contact with the upper and lower surfaces of the wafer W while the roll sponges 77, 78 are rotated about their horizontally-extending axes, thereby scrubbing the upper and lower surfaces of the wafer W.

After the scrubbing process, the pure water is supplied from the first slit nozzle 112 and the non-illustrated lower pure-water supply nozzle onto the upper and lower surfaces of the wafer W to thereby rinse the wafer W. During rinsing of the wafer W, the chemical liquid is not supplied. Rinsing of the wafer W may be performed with the roll sponges 77, 78 in sliding contact with the upper and lower surfaces of the wafer W, or may be performed with the roll sponges 77, 78 away from the upper and lower surfaces of the wafer W.

In order to more reliably prevent the corrosion of the metal interconnects, an inert gas (e.g., a nitrogen gas) may preferably be dissolved in advance in the pure water to be introduced into the first slit nozzle 112. FIG. 9 is a plan view showing a part of the substrate cleaning apparatus provided with an inert-gas supply module 130 for dissolving the inert gas in the pure water. As shown in FIG. 9, the inert-gas supply module 130 is coupled to the first supply line 121. The inert gas, such as the nitrogen gas, is supplied into the pure water flowing in the first supply line 121, thereby producing pure water containing the inert gas dissolved therein. This pure water containing the inert gas is supplied through the first passage 115 to the first slit nozzle 112 and is further supplied through the first slit nozzle 112 onto the upper surface of the wafer W.

Figure 10A:
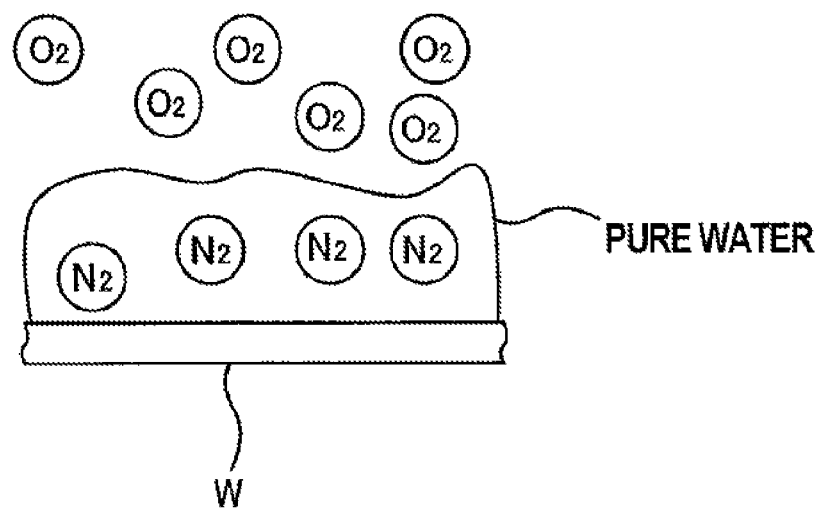
FIG. 10A is a schematic view showing pure water with an inert gas dissolved therein just after the pure water is supplied onto an upper surface of the wafer.
Figure 10B:
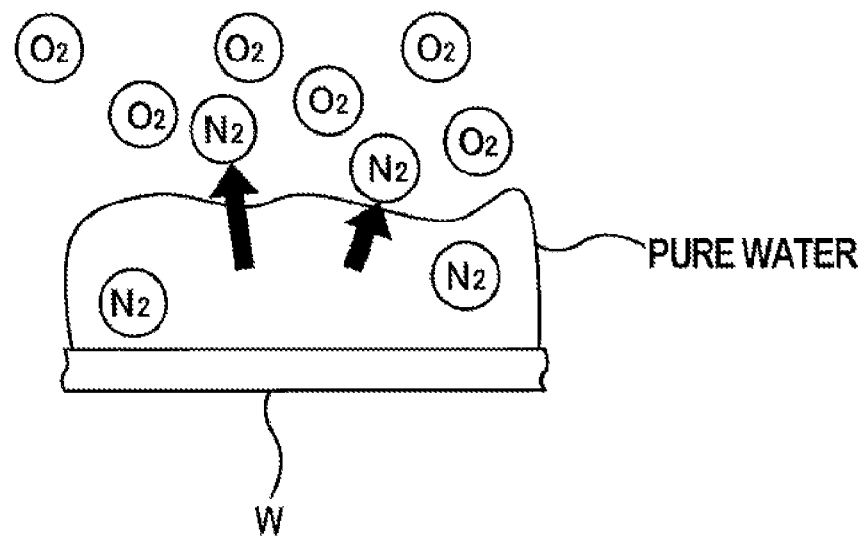
FIG. 10B is a schematic view showing the pure water after a certain period of time has elapsed.

FIG. 10A is a schematic view showing the pure water with the inert gas dissolved therein just after the pure water is supplied onto the upper surface of the wafer W, and FIG. 10B is a schematic view showing the pure water after a certain period of time has elapsed. In this example shown in FIG. 10A and FIG. 10B, the nitrogen gas is used as the inert gas. The pure water on the wafer W and the atmosphere act so as to achieve a balanced state through an interface therebetween. Under this mechanism, the nitrogen gas in the pure water is first released into the atmosphere, and then the oxygen in the atmosphere is dissolved in the pure water. Therefore, it takes a certain period of time until the oxygen in the atmosphere is dissolved in the pure water. The pure water that has been supplied to the wafer W is promptly removed from the wafer W by the centrifugal force of the rotating wafer W after the pure water is used in the scrubbing process of the wafer W with use of the roll sponge 77.

Figure 11A:
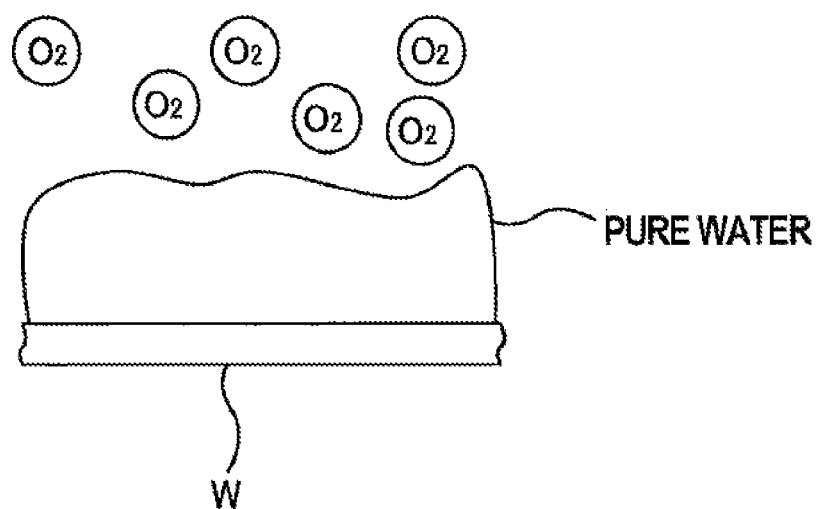
FIG. 11A is a schematic view showing pure water with no inert gas contained therein just after the pure water is supplied onto the upper surface of the wafer.
Figure 11B:
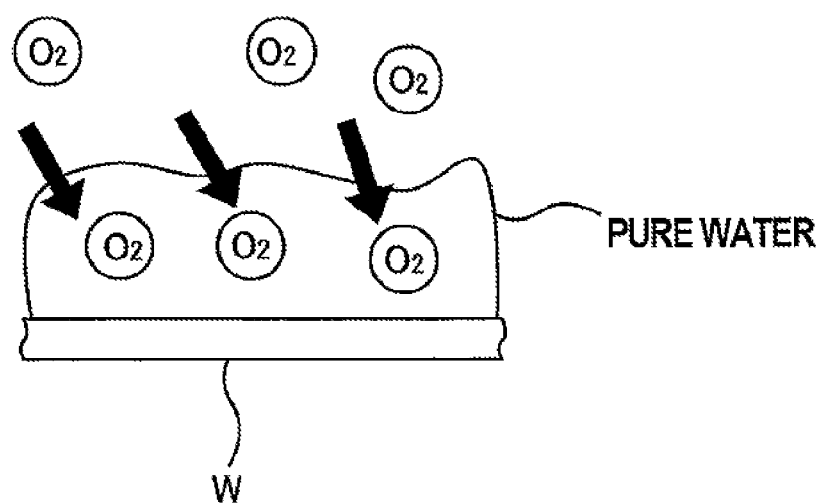
FIG. 11B is a schematic view showing the pure water after a certain period of time has elapsed.

FIG. 11A and FIG. 11B are schematic views each showing a state in which the pure water with no inert gas dissolved therein is supplied onto the wafer W. More specifically, FIG. 11A is a schematic view showing the pure water with no inert gas contained therein just after the pure water is supplied onto the upper surface of the wafer, and FIG. 11B is a schematic view showing the pure water after a certain period of time has elapsed. As shown in FIG. 11A and FIG. 11B, since the pure water and the atmosphere act so as to achieve a balanced state, the oxygen in the atmosphere is likely to be dissolved in the pure water that hardly contains the oxygen therein.

As can be seen from the comparison between FIG. 10B and FIG. 11B, use of the pure water (or ultrapure water) containing the inert gas that has been dissolved therein in advance can more reliably prevent the corrosion of the metal interconnects formed on the surface of the wafer. The ultrapure water containing the inert gas dissolved therein may also be preferably used as the ultrapure water for diluting the chemical liquid.

The present invention can be applied not only to the roll-sponge-type substrate cleaning apparatus, but also to a pen-sponge-type substrate cleaning apparatus. The first cleaning unit 52 and the second cleaning unit 54 shown in FIG. 1 are the roll-sponge-type substrate cleaning apparatus shown in FIG. 3. Instead of this type, the pen-sponge-type substrate cleaning apparatus may be used as the first cleaning unit 52 and/or the second cleaning unit 54. For example, the roll-sponge-type substrate cleaning apparatus may be used as the first cleaning unit 52, and the pen-sponge-type substrate cleaning apparatus may be used as the second cleaning unit 54.

Figure 12:
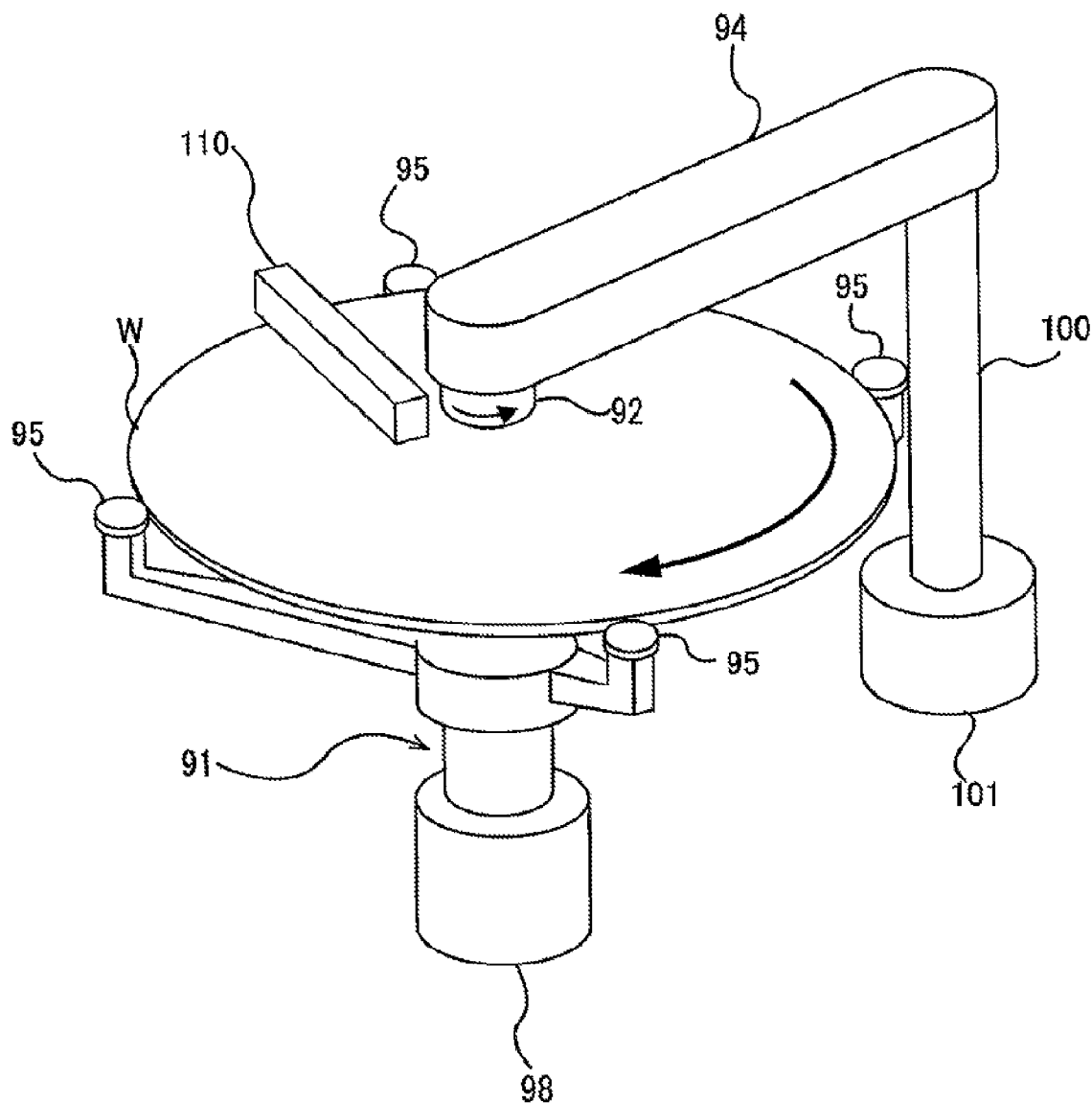
FIG. 12 is a perspective view of a pen-sponge type substrate cleaning unit.

FIG. 12 is a schematic perspective view showing the substrate cleaning apparatus of the pen sponge type. As shown in FIG. 12, this type of substrate cleaning apparatus includes a substrate holder 91 for holding and rotating a wafer W, a pen sponge 92, an arm 94 that holds the pen sponge 92, and the processing-liquid supply module 110 for supplying the processing liquid (e.g., the pure water and the chemical liquid) onto an upper surface of the wafer W. The pen sponge 92 is coupled to a rotating device (not shown) disposed in the arm 94, so that the pen sponge 92 is rotated about its central axis extending in the vertical direction.

The substrate holder 91 includes a plurality of (e.g., four in FIG. 12) chucks 95 each for holding a peripheral edge of the wafer W. The wafer W is held horizontally by these chucks 95. The chucks 95 are coupled to a motor 98, and thus the wafer W, held by the chucks 95, is rotated about an axis thereof by the motor 98.

The arm 94 is disposed above the wafer W. The pen sponge 92 is coupled to one end of the arm 94, and a pivot shaft 100 is coupled to the other end of the arm 94. The pivot shaft 100 is coupled to a motor 101 which serves as an arm rotating device configured to cause the arm 94 to pivot. The arm rotating device may include reduction gears, in addition to the motor 101. The motor 101 rotates the pivot shaft 100 through a predetermined angle to thereby cause the arm 94 to pivot in a horizontal plane that is parallel to the wafer W. With this configuration, as the arm 94 pivots, the pen sponge 92, supported by the arm 94, is moved outwardly in the radial direction of the wafer W.

Figure 13:
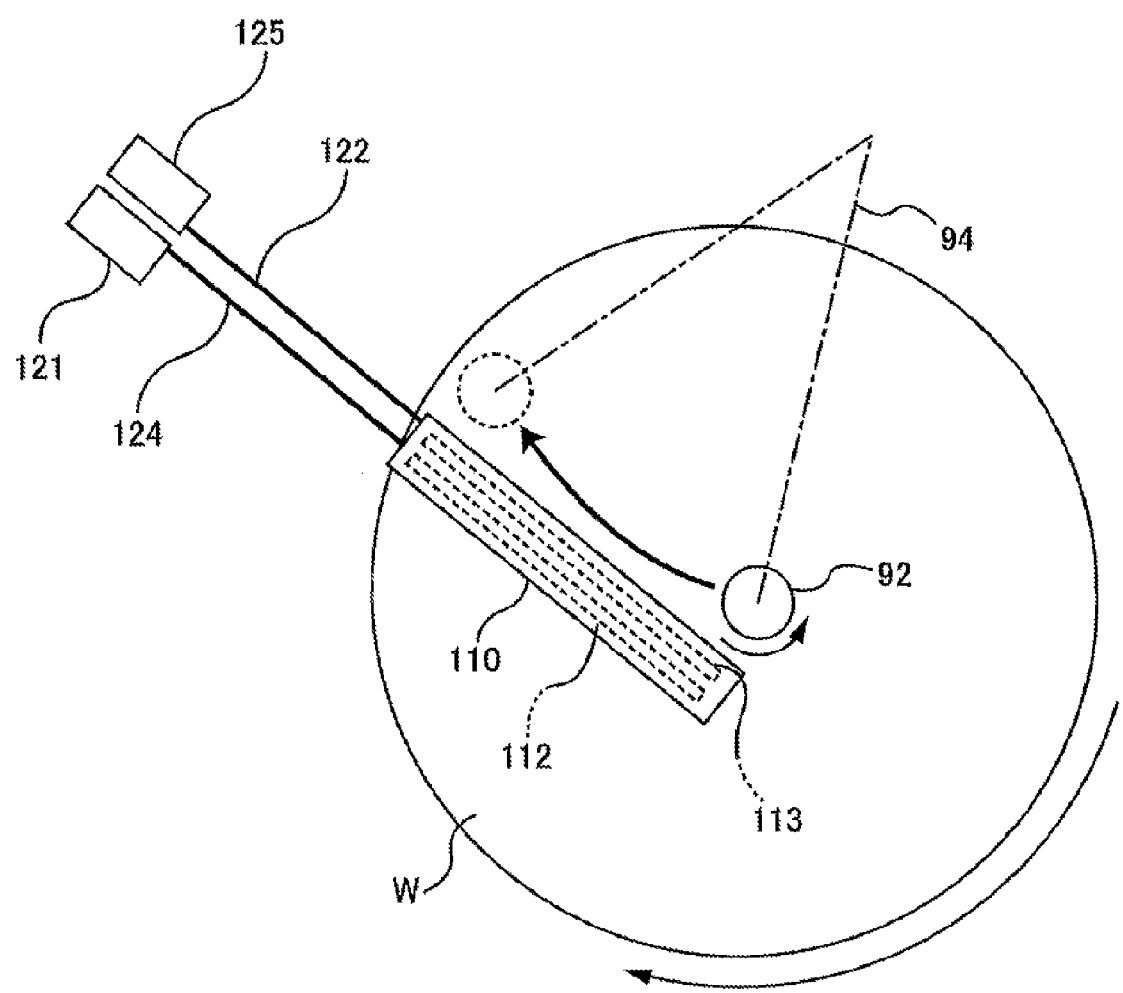
FIG. 13 is a plan view showing a wafer, a pen sponge, and the processing-liquid supply module.

FIG. 13 is a plan view showing the wafer W, the pen sponge 92, and the processing-liquid supply module 110 shown in FIG. 12. As shown in FIG. 13, the processing-liquid supply module 110 is located upstream of the pen sponge 92 with respect to the rotational direction of the wafer W. In this example, the first slit nozzle 112 and the second slit nozzle 113 are not inclined with respect to the radial direction of the wafer W. Other structures of the processing-liquid supply module 110 are identical to those of the processing-liquid supply module 110 shown in FIG. 4 through FIG. 6, and their repetitive descriptions are omitted.

The wafer W is cleaned as follows. First, the wafer W is rotated about its own axis. Subsequently, the pure water and the chemical liquid are supplied from the first slit nozzle 112 and the second slit nozzle 113 (see FIG. 4 and FIG. 5) of the processing-liquid supply module 110 onto the upper surface of the wafer W. In this state, while the pen sponge 92 is rotated about its vertically-extending axis, the pen sponge 92 is placed in sliding contact with upper surface of the wafer W in the presence of the pure water and the chemical liquid. In this manner, the wafer W is scrub-cleaned.

After the scrubbing process, in order to wash away the chemical liquid from the wafer, the pure water is supplied from the first slit nozzle 112 onto the upper surface of the rotating wafer W to thereby rinse the wafer W. During rinsing of the wafer W, the chemical liquid is not supplied. Rinsing of the wafer W may be performed with the pen sponge 92 in sliding contact with the wafer W, or may be performed with the pen sponge 92 away from the wafer W.

The processing-liquid supply module 110 shown in FIG. 4 through FIG. 6 has two slit nozzles, i.e., the first slit nozzle 112 and the second slit nozzle 113. Instead, the processing-liquid supply module 110 may have only one slit nozzle. Further, not only the pure water (or ultrapure water) and the chemical liquid, but also functional water, such as hydrogen water, may be used as the processing liquid. The hydrogen water has a reducing process and is therefore effective in preventing the corrosion of metal, such as copper. However, if a spray nozzle is used to supply the hydrogen water to the wafer, the oxygen in the air is dissolved in the hydrogen water, thus lowering its expected effect. According to the present invention, the functional water, such as the hydrogen water, can be supplied in an optimum manner. Therefore, the functional water can maximize its functions.

Figure 14:
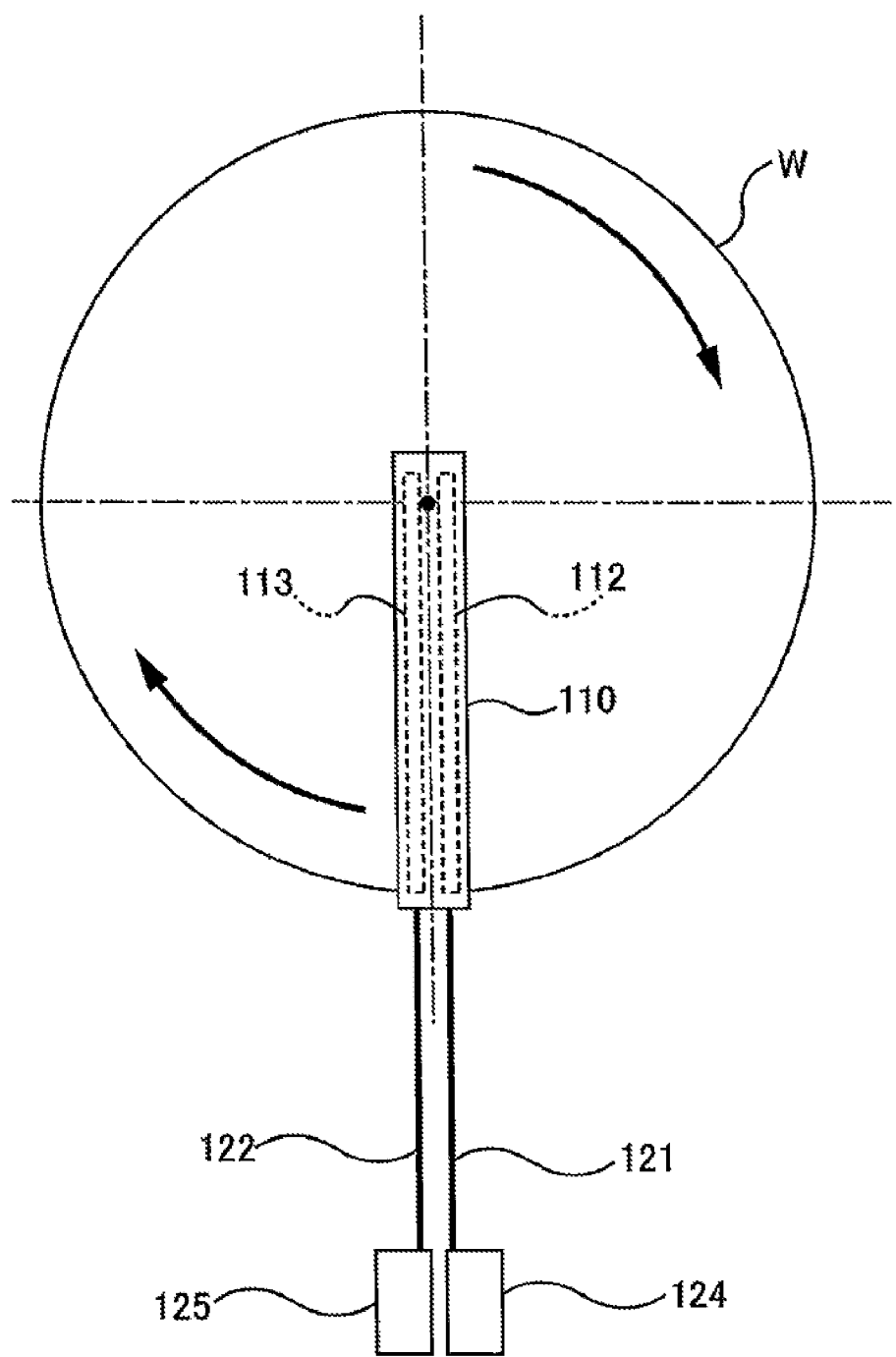
FIG. 14 is a plan view showing a substrate cleaning unit having no scrubbing tool.

While the above-described embodiments of the substrate cleaning apparatus are configured to scrub the wafer W with the scrubbing tool (a roll sponge or a pen sponge) while supplying the processing liquid onto the wafer W, it is possible to perform cleaning of the wafer W by simply supplying the processing liquid onto the wafer W. For example, FIG. 14 is a plan view showing a substrate cleaning apparatus having no scrubbing tool. In this embodiment, the first slit nozzle 112 and the second slit nozzle 113 extend in the radial direction of the wafer W (i.e., the nozzles are not inclined with respect to the radial direction of the wafer W). Other structures are the same as those shown in FIG. 3 through FIG. 6.

In the above-described embodiments the substrate processing apparatus is applied to the substrate cleaning apparatus. The apparatus according to the present invention can also be applied to an apparatus for drying a substrate. For example, the present invention can be applied to a substrate drying apparatus capable of supplying pure water (or ultrapure water) onto a substrate surface while rotating the substrate at a low speed, and then rotating the substrate at a high speed to spin-dry the substrate.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:
1. A substrate cleaning apparatus, comprising:
   a substrate holder configured to hold a substrate horizontally and rotate the substrate;
   a slit nozzle configured to supply a processing liquid onto a surface of the substrate while the substrate is being rotated by the substrate holder, the slit nozzle having an outer end located at a peripheral portion of the substrate, and an inner end located at a central portion of the substrate, the slit nozzle being adjacent to the surface of the substrate and extending in approximately a radial direction of the substrate, and the slit nozzle being inclined, from a direction perpendicular to the surface of the substrate, toward a downstream side with respect to a moving direction of the substrate; and a scrubbing tool configured to scrub the surface of the substrate, the slit nozzle being adjacent to the scrubbing tool wherein the inner end of the slit nozzle is located beside a center of the scrubbing tool, and the outer end of the slit nozzle is located beside an end portion of the scrubbing tool.

2. The substrate cleaning apparatus according to claim 1, wherein an angle of inclination of the outer end at the peripheral portion of the substrate is larger than an angle of inclination of the inner end at the central portion of the substrate.

3. The substrate cleaning apparatus according to claim 2, wherein an angle of inclination of the slit nozzle increases gradually from the angle of inclination of the inner end at the central portion of the substrate to the angle of inclination of the outer end at the peripheral portion of the substrate.

4. The substrate cleaning apparatus according to claim 1, wherein a flow rate of the processing liquid at a central portion of the substrate is higher than a flow rate of the processing liquid at the peripheral portion of the substrate.

5. The substrate cleaning apparatus according to claim 1, further comprising:

an inert-gas supply module configured to dissolve an inert gas in the processing liquid that is delivered to the slit nozzle.

6. The substrate cleaning apparatus according to claim 1, wherein the slit nozzle comprises a first slit nozzle for supplying a first processing liquid onto the surface of the substrate and a second slit nozzle for supplying a second processing liquid onto the surface of the substrate.

7. The substrate cleaning apparatus according to claim 6, wherein the first slit nozzle and the second slit nozzle are inclined at the same angle with respect to a vertical direction.

8. The substrate cleaning apparatus according to claim 1, wherein a length of the slit nozzle is longer than a radius of the substrate but is shorter than a diameter of the substrate.

9. The substrate cleaning apparatus according to claim 1, wherein the inner end is inclined at a first angle with respect to a vertical direction, and the outer end is inclined at a second angle with respect to the vertical direction, the second angle being larger than the first angle.

10. A substrate cleaning apparatus comprising:

a substrate holder configured to hold a substrate horizontally and rotate the substrate; and a slit nozzle configured to supply a processing liquid onto a surface of the substrate while the substrate is being rotated by the substrate holder, the slit nozzle being adjacent to the surface of the substrate and extending in approximately a radial direction of the substrate, and the slit nozzle being inclined, from a direction perpendicular to the surface of the substrate, toward a downstream side with respect to a moving direction of the substrate, wherein the slit nozzle has an inner end inclined at a first angle with respect to a vertical direction, and further has an outer end inclined at a second angle with respect to the vertical direction, the second angle being larger than the first angle, and wherein an angle of inclination of the slit nozzle increases gradually from the first angle at a central portion of the substrate to the second angle at a peripheral portion of the substrate.

* * * * *